(12) United States Patent
Huang et al.

(10) Patent No.: US 9,608,236 B2
(45) Date of Patent: Mar. 28, 2017

(54) DISPLAY PANEL

(71) Applicant: Ye Xin Technology Consulting Co., Ltd., Hsinchu (TW)

(72) Inventors: Li-Chiao Huang, Hsinchu (TW); Chia-Yi Tsai, Hsichu (TW); Chien-Ming Huang, Hsinchu (TW); Kuan-Wei Chou, Hsinchu (TW); Shih-Pin Tseng, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/690,860

(22) Filed: Apr. 20, 2015

(65) Prior Publication Data

US 2016/0190515 A1 Jun. 30, 2016

(30) Foreign Application Priority Data

Dec. 30, 2014 (TW) .............................. 103146236 A

(51) Int. Cl.
*H01L 51/52* (2006.01)
*G02B 5/20* (2006.01)
*H01L 27/32* (2006.01)

(52) U.S. Cl.
CPC .......... *H01L 51/5281* (2013.01); *G02B 5/201* (2013.01); *H01L 27/3211* (2013.01); *H01L 51/5271* (2013.01)

(58) Field of Classification Search
CPC combination set(s) only.
See application file for complete search history.

(56) References Cited

U.S. PATENT DOCUMENTS

| | | | |
|---|---|---|---|
| 7,986,088 B2 | 7/2011 | Sekiya et al. | |
| 2005/0208329 A1* | 9/2005 | Conley | C09K 11/06 428/690 |
| 2009/0167971 A1* | 7/2009 | Powers | E06B 9/24 349/18 |
| 2013/0010229 A1* | 1/2013 | Shin | G02F 1/133617 349/62 |
| 2014/0240642 A1* | 8/2014 | Furukawa | H05B 33/0857 349/65 |
| 2015/0228232 A1* | 8/2015 | Lee | G09G 3/3607 345/88 |
| 2015/0301408 A1* | 10/2015 | Li | G02F 1/133621 362/84 |

FOREIGN PATENT DOCUMENTS

TW 200810595 2/2008

* cited by examiner

*Primary Examiner* — Kyoung Lee
*Assistant Examiner* — Ratisha Mehta
(74) *Attorney, Agent, or Firm* — Zhigang Ma

(57) ABSTRACT

A display panel includes a lighting device, a color conversion layer, and a reflective sheet. The lighting device at least includes a first lighting part emitting a first light of a first color having a wavelength within the first wavelength range and a second lighting part emitting a second light of the first color having a wavelength within a second wavelength range. The color conversion layer includes a number of bases corresponding to the first lighting part and the second lighting part. The reflective sheet reflects a light having a wavelength within a first wavelength range and lets a light having a wavelength out of the first wavelength range to pass through. The bases corresponding to the first lighting part are doped with a number of quantum dot particles to convert the first light to a third light of a second color.

12 Claims, 7 Drawing Sheets

DISPLAY PANEL

FIELD

The disclosure generally relates to display panel technologies.

BACKGROUND

An organic light emitting diode (OLED) display panel usually employs different OLED materials to emit light of three-primary colors. However, luminance of three-primary colors light emitted by the OLED materials are different. Luminance decay of each OLED material is also different. Thus, the color gamut of the OLED display panel is compromised. In order to improve the color gamut of the OLED display panel, a number of circuits need to be set on the OLED display panel to compensate for the differences of luminance of three-primary colors light and luminance decay of different OLED material, which increases complexity of the circuits and cost of the OLED display panel.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
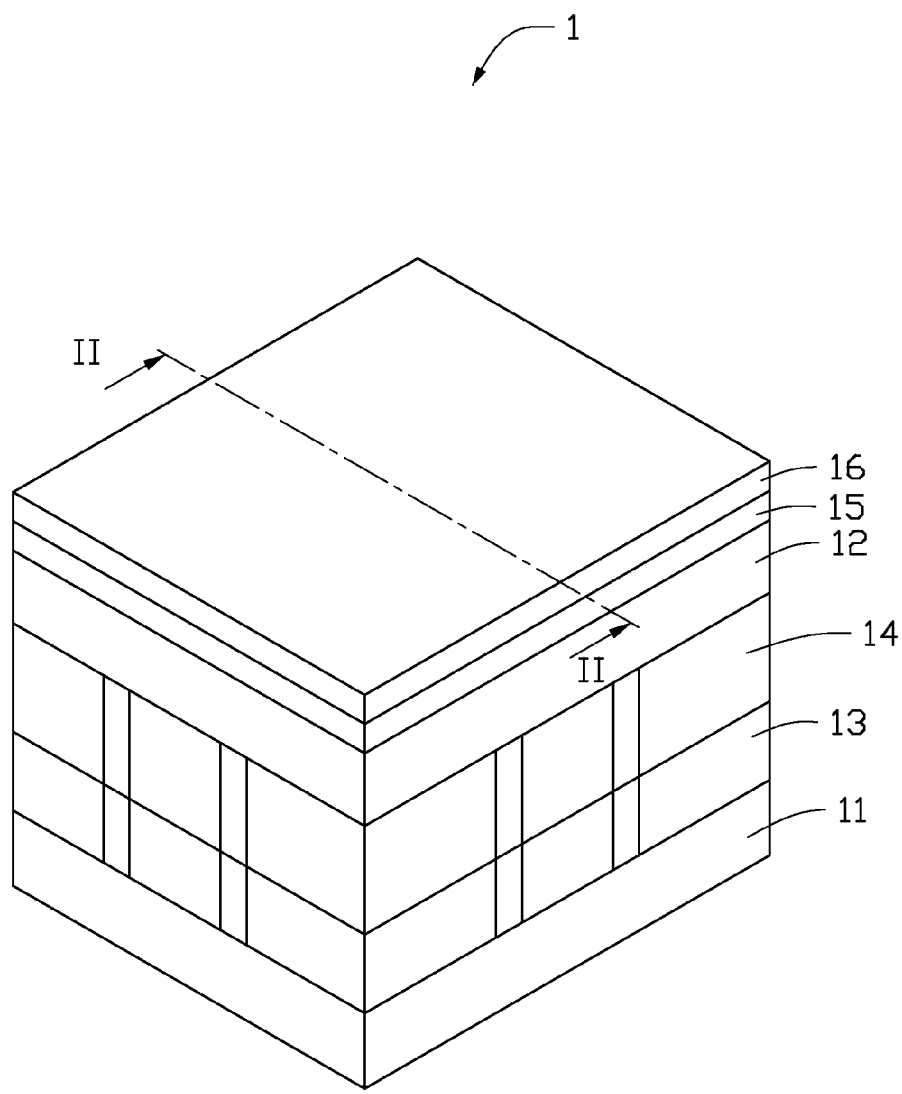
FIG. 1 is an isometric view of a first embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 2:
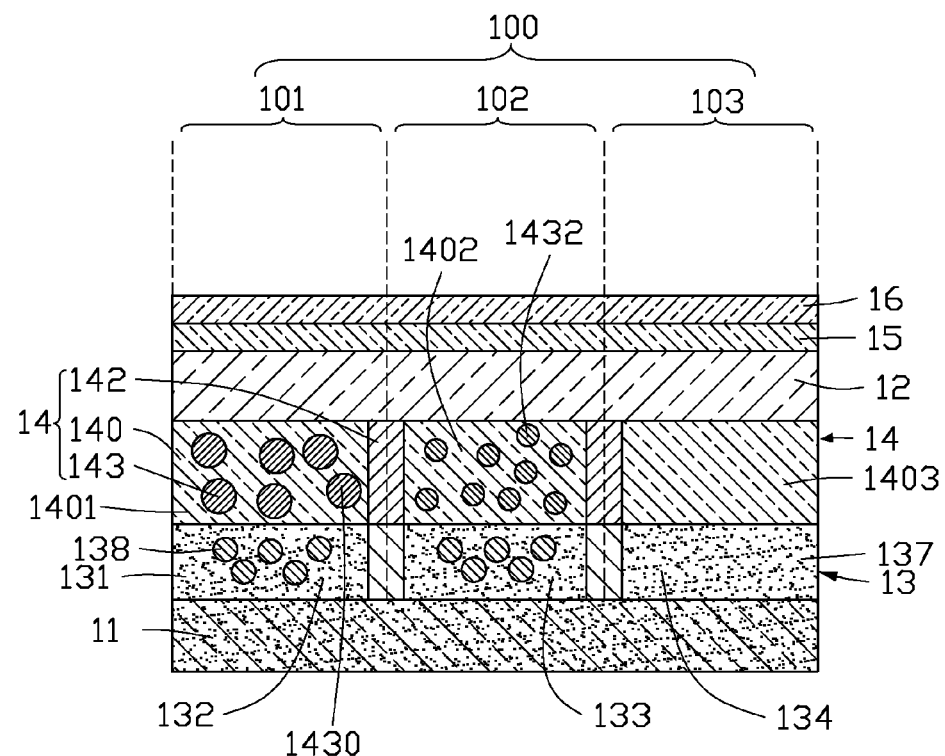
FIG. 2 is a cross-sectional view of the display panel of FIG. 1, taken along line II-II.

FIG. 1 illustrates an isometric view of a first embodiment of a display panel 1. FIG. 2 illustrates a cross-sectional view of the display panel 1 of FIG. 1, taken along line II-II. FIG. 2 illustrates one pixel area 100 for example. The display panel 1 displays a full color image. The display panel 1 can be a liquid crystal display (LCD) panel or an organic light emitting diode (OLED) display panel. In this embodiment, the display panel 1 is an OLED display panel.

The display panel 1 includes a first substrate 11, a second substrate 12 opposite to the first substrate 11, a lighting device 13, a color conversion layer 14, a polarizer 15, and a reflective sheet 16. The display panel defines a number of pixel areas 100. Each pixel area 100 at least includes a first sub-pixel 101, a second sub-pixel 102, and a third sub-pixel 103 for emitting light of different colors. In this embodiment, the display panel 1 employs three-primary colors light to display the full color image. The first sub-pixel 101 emits red light. The second sub-pixel 102 emits green light. The third sub-pixel 103 emits blue light.

The lighting device 13 is formed between the first substrate 11 and the second substrate 12 to be served as a backlight. In this embodiment, the lighting device 13 is an OLED array substrate emitting blue light. The lighting device 13 is divided into a number of lighting parts 131. Each of the lighting parts 131 corresponds to one of the pixel areas 100 of the display panel 1. In this embodiment, the lighting device 13 is divided into a first lighting part 132, a second lighting part 133, and a third lighting part 134. The first lighting part 132 corresponds to the first sub-pixel 101. The second lighting part 133 corresponds to the second sub-pixel 102. The third lighting part 134 corresponds to the third sub-pixel 103.

The first substrate 11 is an array substrate formed with array of thin film transistors (TFTs). Each of the lighting parts 131 is driven by a corresponding TFT of the TFT array. In this embodiment, a surface of the first substrate 11 contacting with the lighting device 13 is coated by a reflective material layer to reflect a part of the light from the lighting device 13 towards an output side of the display panel 1.

Both of the first lighting part 132 and the second lighting part 133 are doped by a number of dopants 138 to emit the blue light. A first wavelength of the blue light emitted from the first lighting part 132 and the second lighting part 133 is within a first wavelength range. In this embodiment, the first wavelength range is defined from 480 nanometers to 500 nanometers. A material of the dopants 138 is selected from a group consisting of 2,5,8,11-Tetra-tert-butylperylene (TBPe) and 1-4-Di-[4-(N,N-diphenyl)amino]styryl-benzene (DSA-Ph). The third lighting part 134 emits the blue light having a second wavelength within a second wavelength range. In this embodiment, the second wavelength is defined from 450 nanometers to 460 nanometers.

The color conversion layer 14 is set between the lighting device 13 and the second substrate 12. The color conversion layer 14 is configured to convert the light emitted from the lighting device 13 to light with different colors for displaying a full color image.

In this embodiment, the color conversion layer 14 includes a number of bases 140, a black matrix 142, and a number of quantum dot particles 143 formed in the bases 140. The bases 140 are divided by the black matrix 142 and correspond to the sub-pixels 101, 102, and 103 for respectively converting the light emitted from the lighting device 13 to light with different colors. The quantum dots particles 143 converting the light emitted from the lighting device 13 to light with different colors can be selectively doped in the bases 140 according to the color of the light emitted from the sub-pixels 101, 102, and 103 corresponding to the bases 140.

The bases 140 are made of photoresist material. The bases 140 can be formed on the second substrate 12 and patterned as the sub-pixels 101, 102, and 103 by a photolithography process, an ink jet printing process, a microtransfer process, or a silk screen printing process.

The quantum dot particles 143 are made of an inorganic nano-material which can convert the light having a wavelength less than a wavelength of a light with a specific color to the light with the specific color. In this embodiment, the quantum dot particles 143 includes a number of red quantum dot particles 1430 and a number of green quantum dot particles 1432. The red quantum dot particles 1430 converts the light having a wavelength less than a wavelength of red light to the red light. The green quantum dot particles 1432 converts the light having a wavelength less than a wavelength of green light to the green light.

In this embodiment, the bases 140 of the color conversion layer 14 includes a number of transparent first bases 1401 corresponding to the first sub-pixels 101, a number of transparent second bases 1402 corresponding to the second sub-pixels 102, and a number of transparent third bases 1403 corresponding to the third sub-pixels 103. The red quantum dot particles 1430 are formed in the transparent first bases 1401. The green quantum dot particles 1432 are formed in the transparent second bases 1402. The blue light emitted from the first lighting part 132 having the first wavelength within the first wavelength range is converted to the red light by the red quantum dot particles 1430 when passing through the first bases 1401. The blue light emitted from the second lighting part 133 having the first wavelength within the first wavelength range is converted to the green light by the green quantum dot particles 1432 when passing through the second bases 1402. The blue light emitted from the third lighting part 134 having the second wavelength within the second wavelength range is directly emitted out by passing through the transparent third bases 1403.

The quantum dot particles 143 can convert most of the light emitted from the lighting device 13 to the light with the corresponding color when the light emitted from the lighting device 13 passes through the color conversion layer 14. Thus, most of the light emitted from the lighting device 13 can be used to display an image. The availability of backlight of the display panel 1 is improved.

In this embodiment, the polarizer 15 is set on a surface of the second substrate 12 opposite to the color conversion layer 14. The polarizer 15 is a circular polarizer 15. The polarizer 15 is configured to filter out external light reflected inside the display panel 1 or on a surface of the display panel 1.

Figure 3:
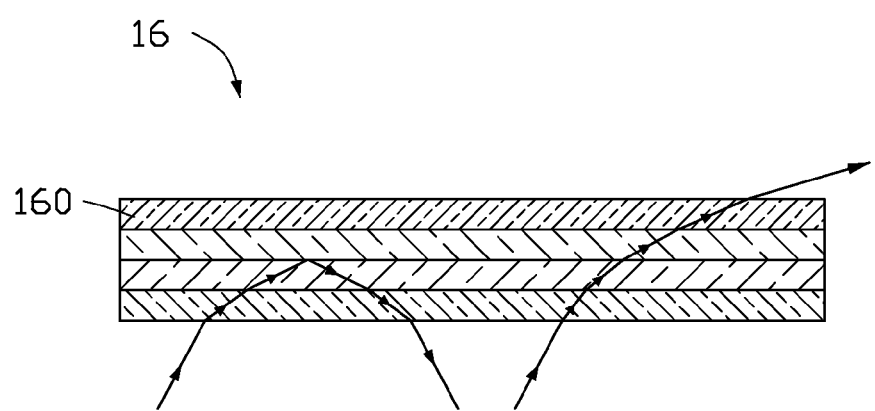
FIG. 3 is a cross-sectional view of a reflective sheet of the display panel of FIG. 1.

In this embodiment, the reflective sheet 16 is set on a side of the polarizer 15 opposite to the second substrate 12. FIGS. 2 and 3 illustrates the reflective sheet 16 includes a number of sublayers 160. Refractive indexes of the sublayers 160 are gradually changed. The reflective sheet 16 is configured to reflect the blue light having the first wavelength within the first wavelength range from the first lighting part 132 and the second lighting part 133 back into the display panel 1. Thus, the blue light having the first wavelength within the first wavelength range reflected by the reflective sheet 16 can pass through the first bases 1401 and the second bases 1402 many times until is completely converted to light with the corresponding color by the red quantum dot particles 1430 and the green quantum dot particles 1432. The reflective sheet 16 is configured to permit light having a third wavelength out of the first wavelength range to pass through.

Figure 4:
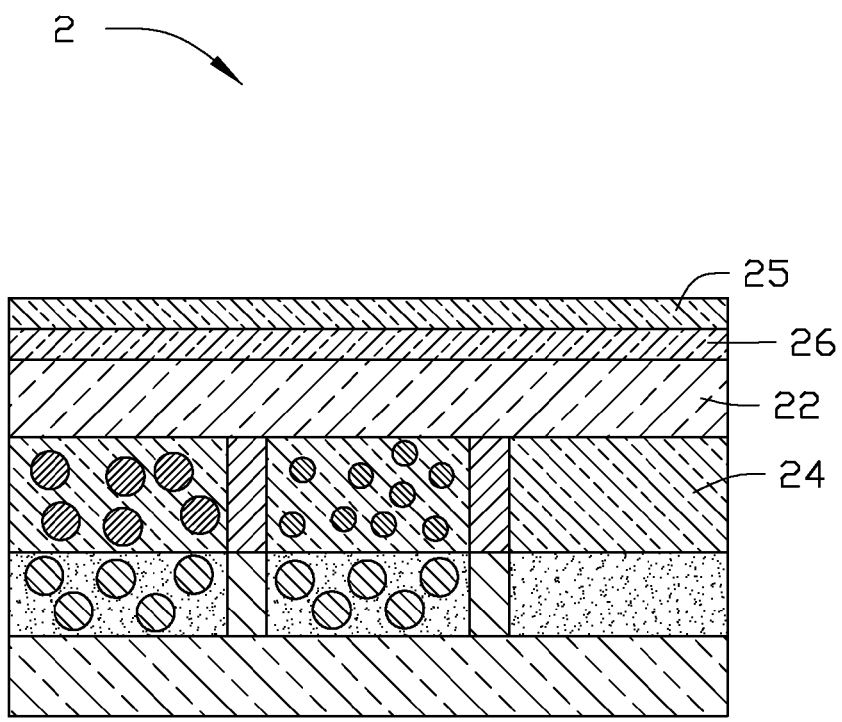
FIG. 4 is a cross-sectional view of a second embodiment of a display panel.

FIG. 4 illustrates a cross-sectional view of a second embodiment of a display panel 2. In this embodiment, the display panel 2 is an OLED display panel. The display panel 2 of the second embodiment is similar to the display panel 1 of the first embodiment except that a reflective sheet 26 of the display panel 2 is set on a surface of a second substrate 22 opposite to a color conversion layer 24. A polarizer 25 is set on a side of the reflective sheet 26 opposite to the second substrate 22.

Figure 5:
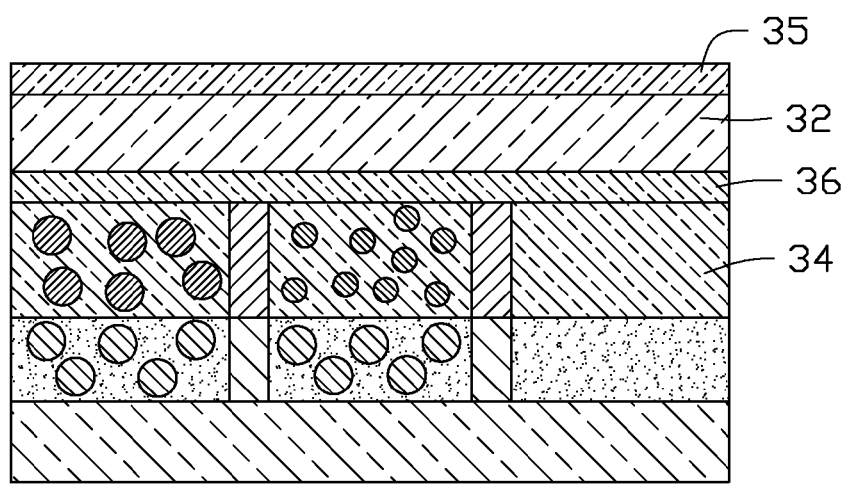
FIG. 5 is a cross-sectional view of a third embodiment of a display panel.

FIG. 5 illustrates a cross-sectional view of a third embodiment of a display panel 3. In this embodiment, the display panel 3 is an OLED display panel. The display panel 3 of the third embodiment is similar to the display panel 1 of the first embodiment except that a reflective sheet 36 of the display panel 3 is set between a second substrate and a color conversion layer 34 of the display panel 3. A polarizer 35 is set on a surface of the second substrate 32 opposite to the reflective sheet 36.

Figure 6:
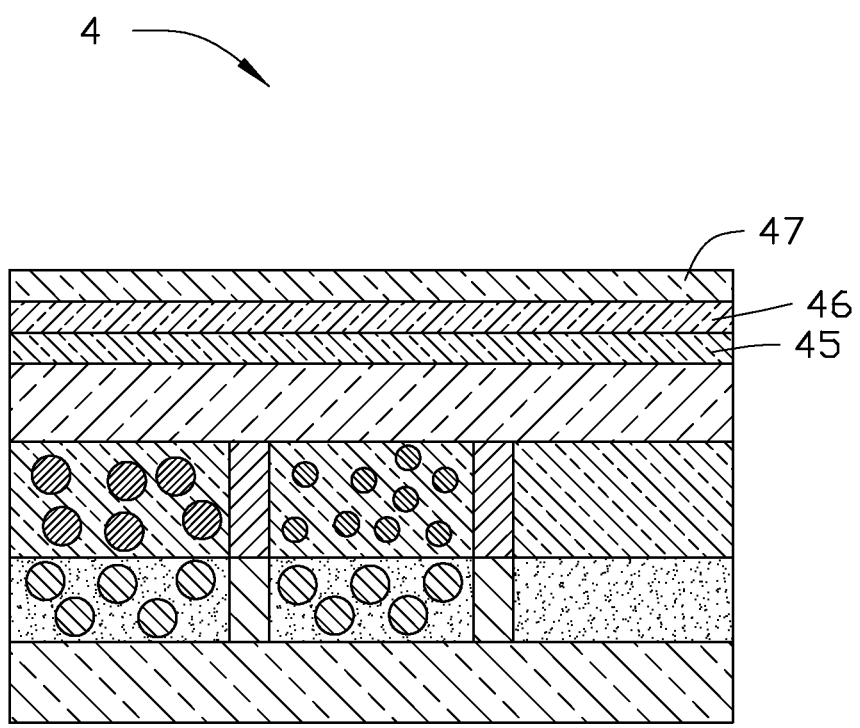
FIG. 6 is a cross-sectional view of a fourth embodiment of a display panel.

FIG. 6 illustrates a cross-sectional view of a fourth embodiment of a display panel 4. The display panel 4 of the fourth embodiment is similar to the display panel 1 of the first embodiment except that the display panel 4 includes a cover glass 47. The cover glass 47 is set on a surface of a reflective sheet 46 opposite to a polarizer 45.

Figure 7:
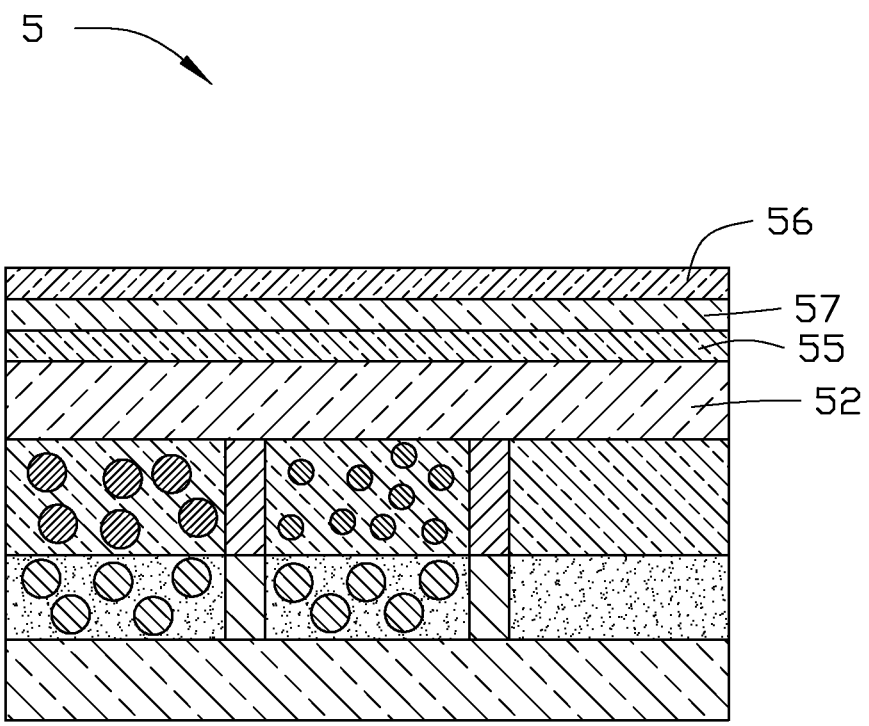
FIG. 7 is a cross-sectional view of a fifth embodiment of a display panel.

FIG. 7 illustrates a cross-sectional view of a fifth embodiment of a display panel 5. The display panel 5 of the fifth embodiment is similar to the display panel 1 of the first embodiment except that the display panel 5 includes a cover glass 57. The cover glass 57 is set on a surface of a polarizer 55 opposite to a second substrate 52. The display panel 5 further includes a reflective sheet 56 set on a surface of the cover glass 57 opposite to the polarizer 55.

It is believed that the present embodiments and their advantages will be understood from the foregoing description, and it will be apparent that various changes may be made thereto without departing from the scope of the disclosure or sacrificing all of its material advantages.

What is claimed is:

1. A display panel defining a plurality of sub-pixels for emitting light with different colors and comprising:
   a lighting device comprising a plurality of lighting parts corresponding to the sub-pixels;
   a color conversion layer comprising a plurality of bases corresponding to the sub-pixels; and
   a reflective sheet configured to reflect light having a wavelength within a range from 480 nm to 500 nm, the reflective sheet configured to permit light having a wavelength out of the range from 480 nm to 500 nm to pass through,
   wherein the lighting device comprises, a first lighting part emitting a first light having a wavelength within a range from 480 nm to 500 nm, and a second lighting part emitting a second light having a wavelength within a range from 450 nm to 460 nm, wherein each of the first light and the second light is monochromatic light of a first color, the bases corresponding to the first lighting part are doped with a plurality of quantum dot particles, the first light is converted to a monochromatic third light of a second color by the plurality of quantum dot particles, the second light is emitted from the display panel by passing through the color conversion layer and the reflective sheet, and portions of the first light not converted by the quantum dot particles are reflected back into the color conversion layer by the reflective sheet.

2. The display panel of claim 1, wherein the first lighting part is doped by a plurality of dopants selected from a group consisting of 2,5,8,11-Tetra-tert-butylperylene and 1-4-Di-[4-(N,N-diphenyl)amino]styryl-benzene.

3. The display panel of claim 1, wherein the display panel employs three-primary colors light to display the full color image and includes a first sub-pixel for emitting red light, a second sub-pixel for emitting green light, and a third sub-pixel for emitting blue light, the first lighting part corresponds to the first sub-pixel, the second lighting part corresponds to the third sub-pixel, the lighting device further comprises a third lighting part corresponding to the second sub-pixel, and the third lighting part emits the first light.

4. The display panel of claim 3, wherein the color conversion layer comprises a first base corresponding to the first sub-pixel, a second base corresponding to the second sub-pixel, and a third base corresponding to the third sub-pixel and without quantum dot particles, the quantum dot particles comprises a plurality of first quantum dot particles doped in the first base and a plurality of second quantum dot particles doped in the second base, the first light from the first lighting part is converted to the third light by the first quantum dot particles, the first light from the third lighting part is converted to a fourth light by the second quantum dot particles, and the fourth light is a monochromatic light of a third color.

5. The display panel of claim 4, wherein the first light and the second light is a blue light, the third light is a red light, and the fourth light is a green light.

6. The display panel of claim 1, wherein the display panel further comprises a first substrate and a second substrate parallel to the first substrate, the lighting device is set on the first substrate, the color conversion layer is set between the lighting device and the second substrate.

7. The display panel of claim 6, wherein the display panel further comprises a polarizer set on a surface of the second substrate opposite to the color conversion, and the reflective sheet is set on a side of the polarizer opposite to the second substrate.

8. The display panel of claim 7, wherein the display panel further comprises a cover glass set on the reflective sheet opposite to the polarizer.

9. The display panel of claim 7, wherein the display panel further comprises a cover glass set on the polarizer opposite to the second substrate, the reflective sheet is set on the cover glass opposite to the polarizer.

10. The display panel of claim 6, wherein the reflective sheet is set on the second substrate opposite to the color conversion, the display panel further comprises a polarizer set on the reflective sheet opposite to the second substrate.

11. The display panel of claim 6, wherein the reflective sheet is set between the second substrate and the color conversion layer, and the polarizer is set on the second substrate opposite to the reflective sheet.

12. A display panel defining a first sub-pixel for emitting red light, a second sub-pixel for emitting green light, and a third sub-pixel for emitting blue light and comprising:
  a lighting device comprising a first lighting part corresponding to the first sub-pixel, a second lighting parts corresponding to the second sub-pixel, and a third lighting part corresponding the third sub-pixel;
  a color conversion layer comprising a first base corresponding to the first sub-pixel, a second base corresponding to the second sub-pixel, and a third base corresponding to the third sub-pixel; and
  a reflective sheet configured to reflect light having a first wavelength within a range from 480 nm to 500 nm, the reflective sheet configured to permit light having a second wavelength out of the range from 480 nm to 500 nm to pass through;
  wherein the first lighting part and the third lighting part emit blue light having the first wavelength within the range from 480 nm to 500 nm, the second lighting part emits blue light having a third wavelength within a range from 450 nm to 460 nm, the first base is doped with a plurality of first quantum dot particles to convert the blue light having the first wavelength to red light, the second base is doped with a plurality of second quantum dot particles to convert the blue light having the first wavelength to green light, the blue light having the third wavelength emits out of the display panel by passing through the color conversion layer and the reflective sheet, and the blue light having the first wavelength, which has not been converted by the first quantum dot particles and the second quantum dot particles, is reflected back into the color conversion layer by the reflective sheet.

* * * * *